United States Patent
Widener

(10) Patent No.: US 10,288,648 B2
(45) Date of Patent: May 14, 2019

(54) REMOTE SENSING SYSTEM

(71) Applicant: Texas Instruments Incorporated, Dallas, TX (US)

(72) Inventor: Steven Rowland Widener, Palm Bay, FL (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 199 days.

(21) Appl. No.: 14/526,281

(22) Filed: Oct. 28, 2014

(65) Prior Publication Data

US 2015/0130445 A1 May 14, 2015

Related U.S. Application Data

(60) Provisional application No. 61/904,269, filed on Nov. 14, 2013.

(51) Int. Cl.
*G01R 19/25* (2006.01)
*G01R 15/18* (2006.01)

(52) U.S. Cl.
CPC .................................. *G01R 15/18* (2013.01)

(58) Field of Classification Search
CPC ...... G01D 5/00; G01D 5/2046; G01D 5/2053; G01R 15/18; G01R 33/02; G01R 19/25; G01B 7/003
USPC ..................................................... 324/207.17
See application file for complete search history.

(56) References Cited

U.S. PATENT DOCUMENTS

| | | | | |
|---|---|---|---|---|
| 4,560,930 A * | 12/1985 | Kouno | .................... | G01B 7/004 324/207.17 |
| 4,973,912 A * | 11/1990 | Kaminski | ........... | B60R 21/0173 324/652 |
| 5,394,084 A * | 2/1995 | Snyder | ................. | G01N 27/023 324/202 |
| 5,446,379 A * | 8/1995 | Machi | .................... | G01N 27/82 324/207.17 |
| 2005/0021255 A1* | 1/2005 | Ramesh | ............. | G01R 27/2611 702/66 |
| 2010/0045366 A1* | 2/2010 | Rossner | .................... | G01D 5/00 327/538 |
| 2012/0330599 A1* | 12/2012 | Roberts | .............. | G01R 33/0064 702/150 |

(Continued)

OTHER PUBLICATIONS

U.S. Appl. No. 14/250,825, filed Apr. 11, 2014 for "Contactless Resistance Measurement," 16 pages.

*Primary Examiner* — Tung X Nguyen
*Assistant Examiner* — Robert P Alejnikov, Jr.
(74) *Attorney, Agent, or Firm* — Andrew Viger; Charles A. Brill; Frank D. Cimino

(57) ABSTRACT

Remote sensors and methods of remote sensing are disclosed. A remote sensor includes a first circuit and a second circuit. The first circuit includes a first coil, a magnetic field generator for driving a current through the first coil to generate a magnetic field, and circuitry for determining loading of the magnetic field. The second circuit includes a second coil located proximate the first coil and a voltage-to-current converter for converting a voltage at an input of the second circuit to current and applying the current to the second coil. The current in the second coil registers as a loading of the magnetic field generated by the first coil. The loss, in response to the loading of the magnetic field, is measurable by the first circuit.

20 Claims, 5 Drawing Sheets

(56) References Cited

U.S. PATENT DOCUMENTS

2013/0106412 A1* 5/2013 Nomura ............... G01R 15/205
                                                                324/252
2013/0109337 A1* 5/2013 He .......................... H04B 1/28
                                                                455/256

\* cited by examiner

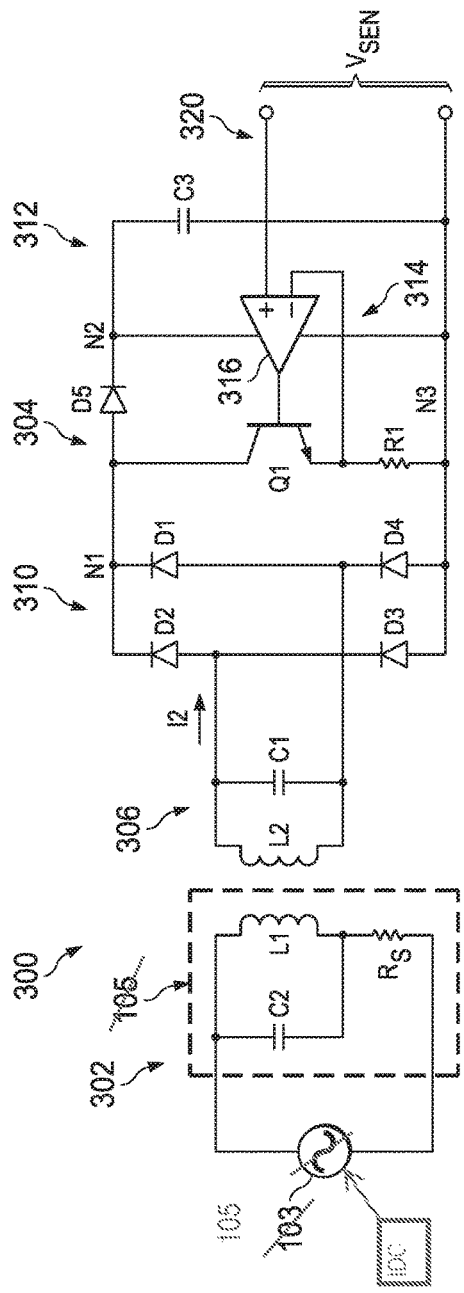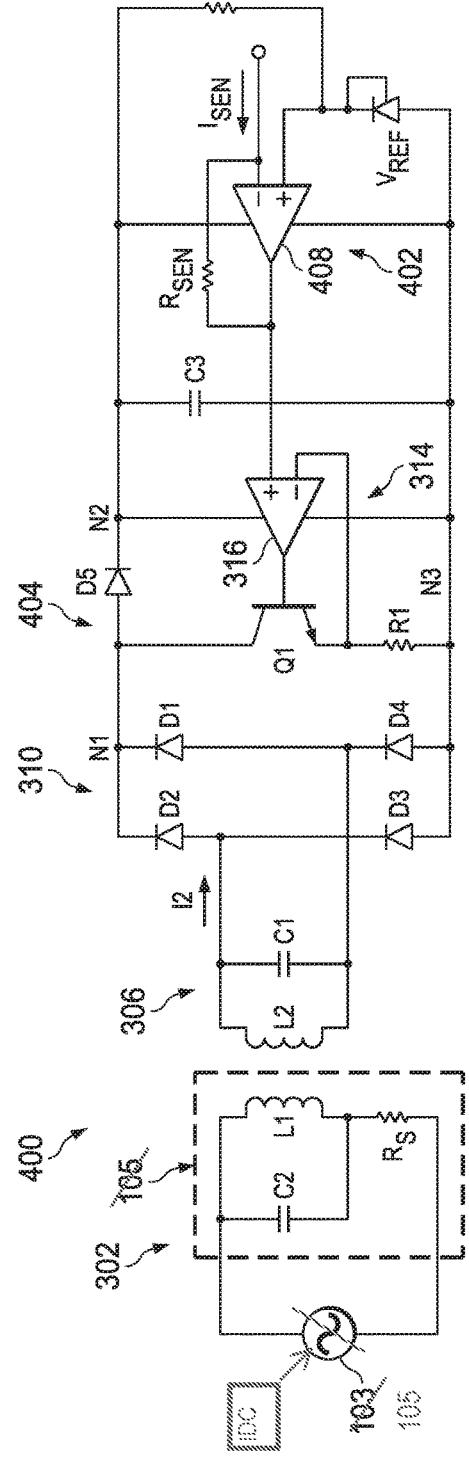
FIG. 3
FIG. 4

REMOTE SENSING SYSTEM

This application claims priority to U.S. provisional patent application 61/904,269 of Steven R. Widener, filed on Nov. 14, 2013 for NON-CONTACT REMOTE VOLTAGE/CURRENT MEASUREMENT TECHNIQUE, which is hereby incorporated by reference for all that is disclosed therein.

BACKGROUND

Some voltage measuring circuits measure voltages on remote circuits wherein there is a substantial common mode voltage difference between the two circuits. Isolation protects the measuring circuit from being damaged by the voltages generated in the remote circuit that are being measured. In some circuits, isolated voltage or current measurements are required for safety and/or operational concerns. One example of this type of measurement is a voltage measurement used in power supply feedback for the purpose of voltage regulation. Some of these power supplies have an optically coupled device to relay information about a voltage of concern across an isolation barrier to a measurement circuit. However, these optically coupled devices are expensive and unreliable.

SUMMARY

This disclosure has several aspects. One aspect of the disclosure is a remote sensor that includes a first circuit and a second circuit. The first circuit includes a first coil, a magnetic field generator for driving a current through the first coil to generate a magnetic field, and circuitry for determining loading of the magnetic field. The second circuit includes a second coil located proximate the first coil and a voltage-to-current converter for converting a voltage at an input of the second circuit to current and applying the current to the second coil. The current in the second coil registers as a loading of the magnetic field generated by the first coil. The loss, in response to the loading of the magnetic field, is measurable by the first circuit.

In some aspects of the remote sensor, the first circuit includes an inductance to digital converter. In other aspects, the magnetic field in the first coil induces a voltage in the second coil and the voltage induced in the second coil may drive at least one electronic component on the second circuit. The second circuit may include a rectifier and/or a filter coupled to the second coil, for rectifying and filtering the voltage induced in the second coil.

In some aspects of the remote sensor, the voltage-to-current converter includes a differential amplifier, a transistor, and a resistance. The differential amplifier has a first input and a second input, wherein the first input is coupled to the input of the second circuit. The base of the transistor is coupled to the output of the amplifier. The resistance is coupled between the emitter of the transistor and a common node. Feedback is coupled between the emitter of the transistor and the second input of the amplifier.

A trans-impedance amplifier may be coupled between the input of the second circuit and the voltage-to-current converter, wherein the trans-impedance amplifier is for converting a current flowing at the input to the second circuit to a voltage. In some versions of the remote sensors, a resistance is coupled across the input of the second circuit, wherein the remote sensor is for measuring current flowing through the resistance. A voltage offset may be coupled to the input, for offsetting the voltage at the input of the second circuit.

Other aspects of the remote sensor include a third coil that is coupleable to the first circuit, wherein the third coil is operable to generate a magnetic field. A fourth coil is located proximate the first coil, wherein the magnetic field generated by the third coil induces a voltage in the fourth coil. A resistance having a predetermined value is coupled to the fourth coil. In some aspects, the fourth coil and the resistance are for inducing a predetermined loss in the magnetic field generated by the third coil. The third coil may be coupleable to the magnetic field generator.

Another aspect of the disclosure includes a method for measuring a remote voltage. An example of the method includes generating a magnetic field in a first coil, inducing a voltage in a second coil in response to the magnetic field, converting the remote voltage to a loading current, applying the loading current to the second coil, measuring the loading in the magnetic field in response to the loading current, and correlating the loading in the magnetic field with the magnitude of the remote voltage.

Other aspects include rectifying the voltage induced in the second coil and driving at least one electronic component on the second circuit with the rectified voltage. Another variation includes rectifying the voltage induced in the second coil, filtering the rectified voltage, and driving at least one electronic component on the second circuit with the filtered voltage. Other variations include driving a current through a resistance to generate the remote voltage.

Other aspects include driving a current through a third coil and inducing a magnetic field in a fourth coil in response to the current in the third coil, wherein the fourth coil causes a predetermined loading in the magnetic field. A variation of this aspect includes correlating the loading in the magnetic field with the distance between the first coil and the second coil, wherein the magnitude of the remote voltage is a function of the distance.

Another aspect of the disclosure includes a first circuit and a second circuit. The first circuit includes a first coil, a proximity sensor, and a voltage source for driving a current through the first coil to generate a magnetic field. The proximity sensor determines loading of the magnetic field. The second circuit includes a second coil located proximate the first coil. A voltage-to-current converter converts a voltage at an input of the second circuit to current and drives the current through the second coil. The current in the second coil registers as a loading of the magnetic field generated by the first coil, wherein the loss is measurable by the proximity sensor. A rectifier coupled to the second coil rectifies a voltage induced in the second coil by the magnetic field, wherein the rectified voltage is for driving at least one electronic device on the second circuit.

BRIEF DESCRIPTION OF THE DRAWINGS

FIG. 3 is a detailed schematic diagram illustrating an implementation of the remote sensing system of FIG. 1.

FIG. 4 is a detailed schematic diagram illustrating an implementation of the remote sensing system that includes a trans-impedance amplifier.

DETAILED DESCRIPTION

Figure 1:
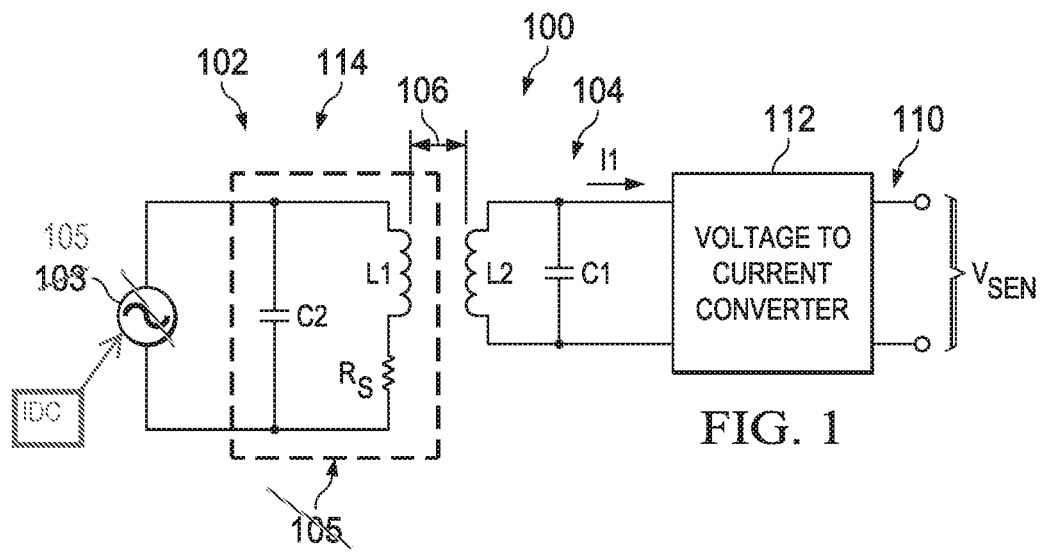
FIG. 1 is a block diagram of a remote sensing system for measuring a remote voltage.

Remote current and/or voltage sensing systems and methods of measuring remote voltages and currents are disclosed herein. Reference is made to FIG. 1, which is a block diagram of a remote voltage sensing system 100. The system 100 includes a first circuit 102 and a second circuit 104. In the example of FIG. 1, the first circuit 102 is a circuit that is conventionally used to determine the distance between a target object (not shown) and a first coil L1. The distance measurement or proximity measurement is conventionally achieved by inducing a magnetic field in the target object and calculating the distance as a function of the losses associated with the target object. The first circuit 102 includes a proximity sensor 105 that calculates distance as a function of losses resulting from the magnetic field induced in the target object.

The system 100 induces a magnetic field in a second coil L2 rather than a target object. The second coil L2 is located a distance 106 from the first coil L1. In some examples of the system 100, the distance 106 is approximately thirty-nine mils (0.99 mm) and the first coil L1 and the second coil L2 are fixed relative to each other so that the distance 106 is a fixed distance. The second circuit 104 further includes an input 110, which in the example of FIG. 1 is coupled to a sensed voltage $V_{SEN}$. The input 110 is also coupled to a voltage-to-current converter 112 that sinks a current I1, wherein the current I1 is proportional to the voltage at the input 110. The current I1 loads a tank circuit 104 that includes the second coil L2 and a capacitor C1. The current I1 is sometimes referred to as the loading current. A magnetic field is generated by the first circuit 102 by driving current through a tank circuit 114 that includes the first coil L1 and a capacitor C2. The magnetic coupling of the second coil L2 to the first coil L1 results in a loss detected by the proximity sensor 105 due to the magnetic field generated by the first coil L1. The loss is registered as the virtual resistance $R_S$ by the proximity sensor 105 and is used to calculate the distance between the first coil L1 and the second coil L2. The distance measurement calculated by the proximity sensor 105 is a function of the sensed voltage $V_{SEN}$ because the distance 106 between the coils L1 and L2 is fixed. More specifically, the voltage $V_{SEN}$ is converted to a current that simulates a distance measurement calculated by the first circuit 102. The sensed voltage $V_{SEN}$ is then readily calculated as a function of the distance calculated by the proximity sensor 105. More specifically, the proximity sensor 105 measures magnetic losses that are correlated to the sensed voltage $V_{SEN}$. Accordingly, the system 100 measures the sensed voltage $V_{SEN}$ without any physical connection between the first circuit 102 and the second circuit 104.

Having summarily described the system 100, it will now be described in greater detail. The first circuit 102 includes the proximity sensor 105, which in some examples includes or is based around an inductance-to-digital converter, such as the LDC1000 manufactured by the Texas Instruments Corporation of Dallas, Tex., USA. The inductance-to-digital converter includes an alternating current (AC) voltage or current source (e.g., voltage source 103) that drives a current through the first coil L1, which generates a magnetic field. When a target object that includes a conductive material, such as a metal target, is brought into the proximity of the first coil L1, the magnetic field induces circulating currents (eddy currents) within the target object. The eddy currents are a function of the distance, size, and composition of the target. The eddy currents generate their own magnetic field, which opposes the magnetic field generated by the first coil L1. The magnetic field mechanism is similar to a transformer, where the first coil L1 is the primary coil and the eddy currents are the secondary core. The inductive coupling between the primary coil and the secondary coil depends on the distance and shapes of the cores. Hence, the resistance and inductance of the secondary coil (eddy current) is detected as a distant dependent resistive and inductive component in the coil L1. As described above, the system 100 replaces the target object with the second coil L2.

The voltage source 103 generates current that causes an alternating magnetic field to be generated by the tank circuit 114, which includes the first inductor L1 and the capacitor C2. The voltage source 103 may be an AC voltage source. In some embodiments, the proximity sensor is implemented as the tank circuit 114. The parallel coupling of the capacitor C2 and the first inductor L1 minimizes the power consumption of the first circuit 102. The parallel coupling of the first inductor L1 and the capacitor C2 also forms a resonator so that the power consumption is reduced to the eddy currents and inductor losses that are modeled by the resistor $R_S$. The resistor $R_S$ is sometimes referred to as a virtual resistor. Some inductance-to-digital converters simultaneously measure the impedance and resonant frequency of the resonator formed by the tank circuit 104. The inductance-to-digital converters accomplish this task by regulating the oscillation amplitude in a closed loop configuration to a constant level while monitoring the energy dissipated by the resonator. By monitoring the amount of power injected into the resonator, the inductance-to-digital converter determines the value of Rs. The converters can also measure the oscillation frequency of the LC circuit, which is the frequency that determines the inductance of the LC circuit.

Figure 2:
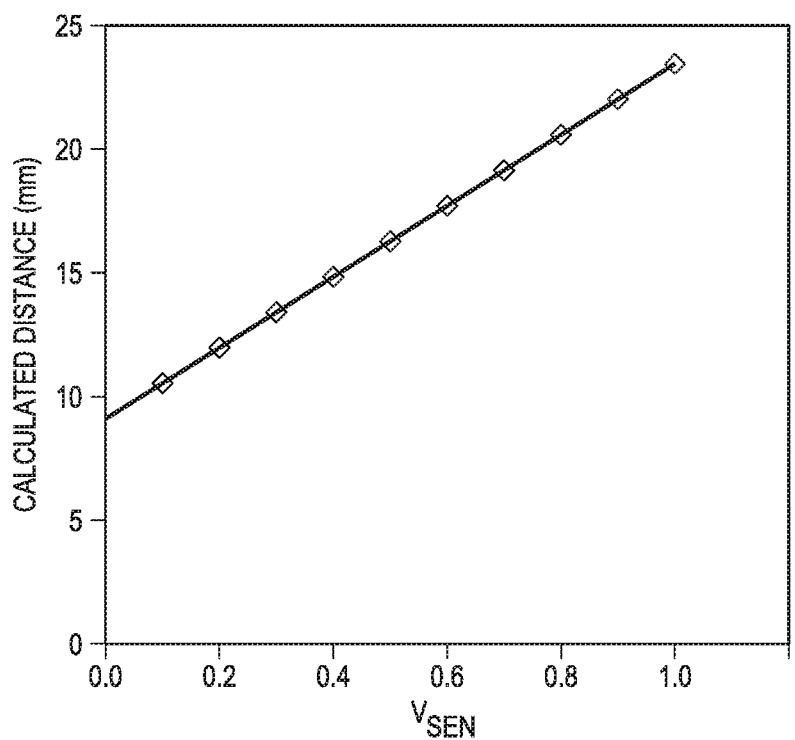
FIG. 2 is a graph depicting the relationship between the sensed voltage of FIG. 1 and the output of the proximity sensor of FIG. 1.

Rather than calculating parameters of a target, the first circuit 102 calculates parameters of the effects generated by the loading of the second coil L2 on the magnetic field generated by the first coil L1. The coupling of the magnetic field by the second coil L2 simulates eddy current losses that are proportional to the sensed voltage $V_{SEN}$ at the input 110 to the voltage-to-current converter 112. The loading of the magnetic field resulting from the second coil L2 is measured by the first circuit 102, wherein the distance determined by the first circuit 102 is proportional to loading by the second coil L2. The loading of the second coil L2 is a function of the sensed voltage $V_{SEN}$, so the distance measurement calculated by the first circuit 102 is a function of the sensed voltage $V_{SEN}$. FIG. 2 is an example graph showing the relation between the sensed voltage $V_{SEN}$ and the distance 106 calculated by the first circuit 102.

Reference is made to FIG. 3, which is a detailed schematic diagram illustrating an implementation of the remote sensing system 100 of FIG. 1. FIG. 3 illustrates a system 300 that includes a first circuit 302 and a second circuit 304. The first circuit 302 is similar to the first circuit 102 of FIG. 1. The second circuit 304 includes a tank circuit 306 that includes the second coil L2 and the capacitor C1. The tank circuit 306 is tuned to the frequency emitted by the first coil L1. The tank circuit 306 inductively couples the magnetic field generated by the first circuit 302 so a loss is detected by the first circuit 302, wherein the loss is proportional to the sensed voltage $V_{SEN}$. The tank circuit 306 also converts the magnetic field induced on it by the first circuit 302 to an alternating voltage across the coil L2 and the capacitor C1.

The tank circuit 306 is coupled to a rectifier 310 that includes four diodes D1-D4. In some aspects of the rectifier 310, the diodes D1-D4 are BAT54 type diodes. The rectifier 310 performs full wave rectification on the voltage across the coil L2 and the capacitor C2. Accordingly, the voltage at a node N1 is a full wave rectified sine wave. The node N1 is coupled to a filter 312 that includes a diode D5 and a capacitor C3. In some aspects of the filter 312, the diode D5 is a BAT54 type diode and the capacitor C3 has a value of approximately 0.1 uf. The filter 312 filters out AC components from the rectified sine wave so that the voltage at a node N2 is substantially a DC voltage that is capable of providing power to components in the second circuit 304.

The sensed voltage $V_{SEN}$ is coupled to a voltage-to-current converter 314. The voltage-to-current converter 314 includes a differential amplifier 316, a transistor Q1, and a resistor R1. In the example of FIG. 3, the differential amplifier 316 is an operational amplifier and the sensed voltage $V_{SEN}$ is coupled to the non-inverting input of the operational amplifier. In some aspects of the voltage-to-current converter 314, the differential amplifier is an OPA348 type device and is powered by the voltage at the node N2. The amplifier 316 may be selected for rail-to-rail capabilities and low quiescent current to avoid inducing non-linearities in the voltage-to-current transfer function. It is noted that the current powering the amplifier 316 may be much less than the current that loads the voltage at the node N1. The output of the amplifier 316 is coupled to the base of the transistor Q1. The emitter of the transistor Q1 is coupled to the inverting input of the amplifier 316. The collector of the transistor Q1 is coupled to the node N1. A resistor R1 is coupled between the emitter of the transistor Q1 and a common node N3, which may be a ground. In some aspects of the voltage-to-current converter, the transistor Q1 is an MMBT3904 type device and the resistor R1 has a value of approximately 4.99 kΩ. In some implementations, the transistor Q1 may be a MOSFET in order to minimize the voltage-to-current transfer function errors that are due to the limited Hfe of the transistor Q1.

As described above, the tank circuit 306 generates the AC voltage in response to a magnetic field induced on the second inductor L2. The AC voltage is rectified by the rectifier 310. The AC components are removed from the rectified signal to form a substantially DC voltage at node N2 that powers the amplifier 316. Accordingly, the second circuit 304 does not require a separate power supply.

As described above, the proximity determination made by the first circuit 302 is a function of the sensed voltage $V_{SEN}$. The sensed voltage $V_{SEN}$ is presented to the non-inverting input of the amplifier 316, which provides a high impedance for the sensed voltage $V_{SEN}$. The amplifier 316 adjusts its output so that the voltage across the resistor R1 is substantially the same as the sensed voltage $V_{SEN}$. The voltage across the resistor R1 causes a constant current of magnitude $V_{SEN}$/R1 to flow through the emitter of the transistor Q1 and load the tank circuit 306 and the rectifier 310 with a current I2, which is sometimes referred to as a loading current. The field induced by the current I2 appears to the first circuit 302 to represent a loss, noted as the virtual resistor $R_S$, that must be replenished. This loss is reported in the proximity sensor 105 as a proximity reading and is a function of the sensed voltage $V_{SEN}$ for a given physical geometry of coils L1 and L2.

In some examples, the loss calculated by the first circuit 302 is calibrated to the sensed voltage $V_{SEN}$ so that the sensed voltage $V_{SEN}$ is readily calculated. More specifically, the proximity determined by the first circuit 302 is a function of the sensed voltage $V_{SEN}$. Accordingly, the sensed voltage $V_{SEN}$ is readily determined based on the function. In other examples, look-up tables or the like store information regarding the correlation between proximity and the sensed voltage $V_{SEN}$. A processor or similar device (not shown in FIG. 3) may solve the function or retrieve data from the look-up table to determine the sensed voltage $V_{SEN}$. The above-described function or the look-up table may include correction factors to account for non-linearities in the transfer function between distance and sensed voltage $V_{SEN}$, temperature dependency, and corrections determined from calibration information. In addition, other factors including humidity and aging may be used to improve the measurement accuracy.

Some embodiments of the second circuit 304 include a sensing resistor (not shown in FIG. 3) coupled across the input 320 to measure current. The current flow through the sensing resistor generates the sensed voltage $V_{SEN}$ which is determined by the first circuit 302. Reference is made to FIG. 4, which is a system 400 that includes a trans-impedance amplifier 402 coupled to the second circuit 404. The trans-impedance amplifier 402 measures very small sensing currents $I_{SEN}$. The trans-impedance amplifier 402 includes an amplifier 408 with the inverting input coupled to the sensing current $I_{SEN}$. A resistor $R_{SEN}$ provides feedback to the inverting input. A voltage reference $V_{REF}$ is coupled to the non-inverting input of the amplifier 408. The voltage reference $V_{REF}$ provides offset to the amplifier 408 to enable adequate operating headroom for positive and/or negative currents.

Figure 5:
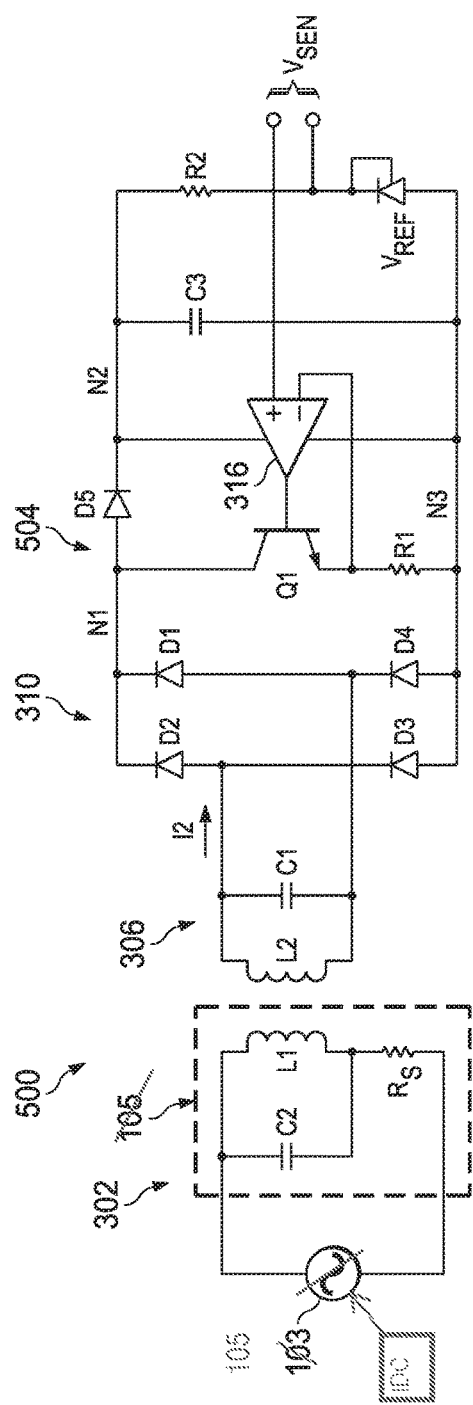
FIG. 5 is a detailed schematic diagram illustrating an implementation of the remote sensing system that includes a voltage offset coupled to the input.

FIG. 5 is an embodiment of a system 500 that senses positive or negative voltages or currents. The second circuit 504 includes an offset reference voltage $V_{REF}$ coupled to the amplifier 316. In the example of FIG. 5, the sensed voltages $V_{SEN}$ that are equal to zero are processed by the second circuit 504 as a fixed offset voltage level. As the sensed voltage $V_{SEN}$ transitions positive or negative, the calculated sensed voltage $V_{SEN}$ will be more or less than the offset level. The proximity sensor 105 or other calculating device coupled thereto may mathematically remove the offset level and provide bipolar measurements for the sensed voltage $V_{SEN}$.

Figure 6:
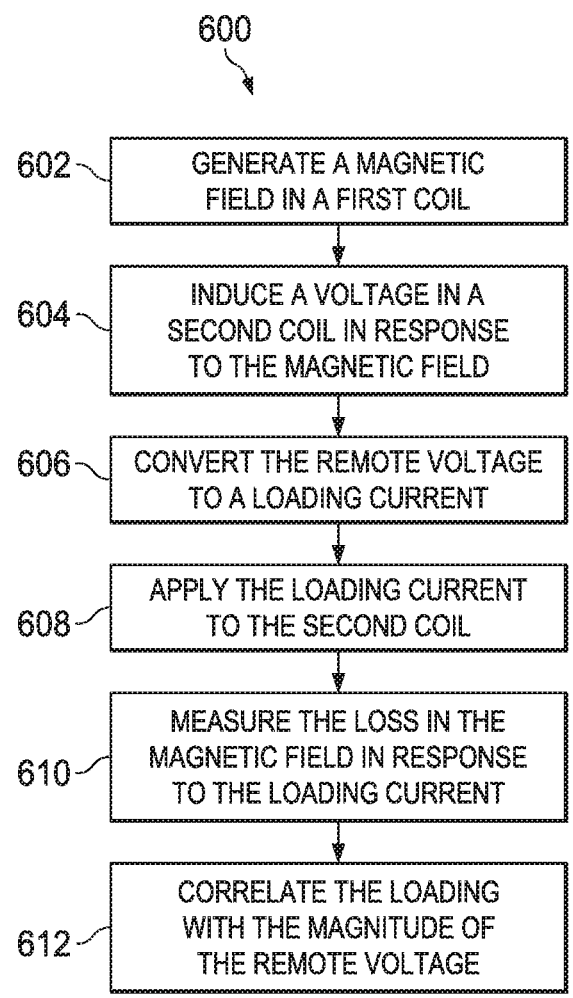
FIG. 6 is a flow chart illustrating the operation of a remote sensing system.

FIG. 6 is a flow chart 600 describing the operation of the system 300 of FIG. 3. In step 602, a magnetic field is generated in the first coil L1. In step 604, a voltage is induced in the second coil L2 in response to the magnetic field. The remote voltage, which is $V_{SEN}$, is converted to a loading current in step 606. In step 608, the loading current is applied to the second coil L2. The loss in the magnetic field in response to the loading current is measured at step 610. The loss of the magnetic field is correlated to the remote voltage in step 612.

Figure 7:
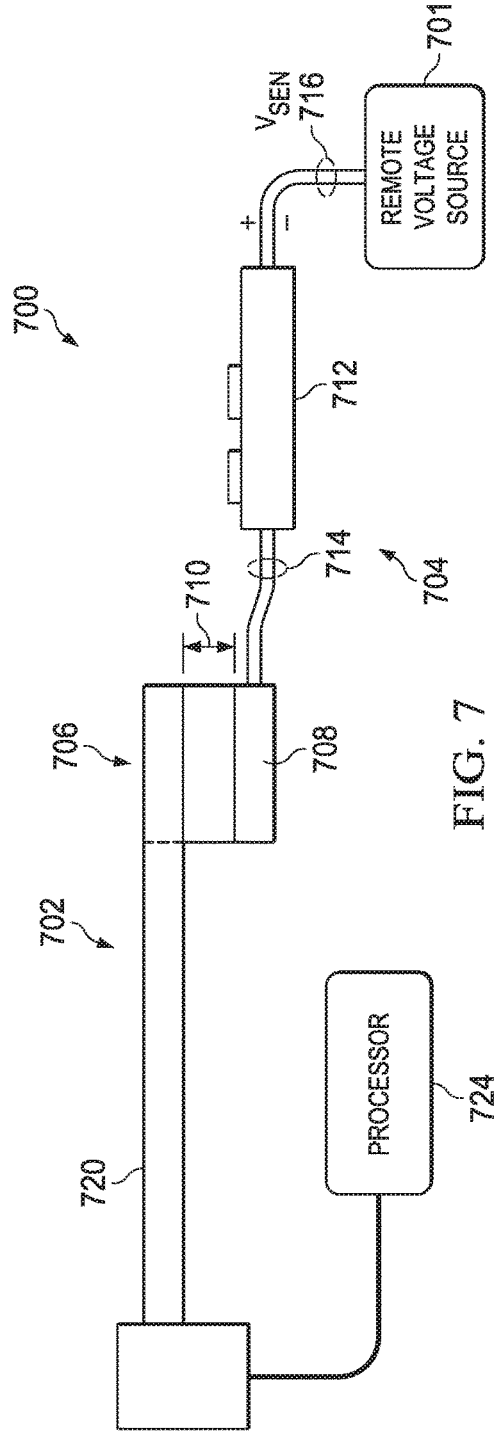
FIG. 7 is a diagram illustrating implementation of a remote sensing system.

FIG. 7 is a block diagram of a remote sensing system 700 implemented to measure a remote sensed voltage $V_{SEN}$ generated by a remote voltage source 701. As with the previous examples, the system 700 includes a first circuit 702 and a second circuit 704. The first circuit 702 has a portion 706 that includes a first coil (not shown in FIG. 7) as depicted by the first coil L1 of FIG. 1. A portion 708 of the second circuit 704 includes a second coil (not shown in FIG. 7) as depicted by the second coil L2 of FIG. 1. A gap 710 having a fixed width is located between the portion 706 and the portion 708 so that the portions 706 and 708 are located a fixed distance from one another. In some aspects of the system 700, the gap 710 is air. In other aspects of the system 700, the gap 710 is filled with a solid structure that secures the portions 706 and 708 and enables a magnetic field to permeate through the gap 710.

The second circuit 704 includes a voltage-to-current converter 712 that is coupled to the portion 708 by conductors 714. In some examples, the portion 708 is on a substrate that includes the voltage-to-current converter 712. The voltage-to-current converter 712 is coupled to the remote voltage source 701 by conductors 716. In some examples of the system 700, the remote voltage source 701 is located on the same substrate as the voltage-to-current converter 712. The first circuit 702 includes a proximity sensor 720, which, in the example of FIG. 7, is located on the same substrate as the portion 706 that includes the first coil. In some examples, the proximity sensor 720 is located on a separate substrate than the portion 706.

The system 700 includes a processor 724 that is coupled to the first circuit 702. The processor 724 receives data generated by the proximity sensor 720 and calculates the sensed voltage $V_{SEN}$ based on the above-described magnetic losses. More specifically, the processor 724 receives proximity data generated by the proximity sensor 720 and correlates the proximity data to the sensed voltage $V_{SEN}$ as described with reference to FIG. 2. In some examples, the processor 724 and the proximity sensor 720 are a single device.

An AC voltage source or current source (e.g., voltage source 103) generates a magnetic field in the coil in the portion 706. The magnetic field permeates through the gap 710 where it induces a voltage across the coil in the portion 708. The voltage-to-current converter 712 converts the sensed voltage $V_{SEN}$ to a loading current that flows through the coil in the portion 708. The proximity sensor 720 detects the loading current in the second coil as a loss and correlates the loss to the distance of the gap 710. The processor 724 correlates the distance of the gap to the sensed voltage $V_{SEN}$ and outputs data indicating the sensed voltage $V_{SEN}$.

Figure 8:
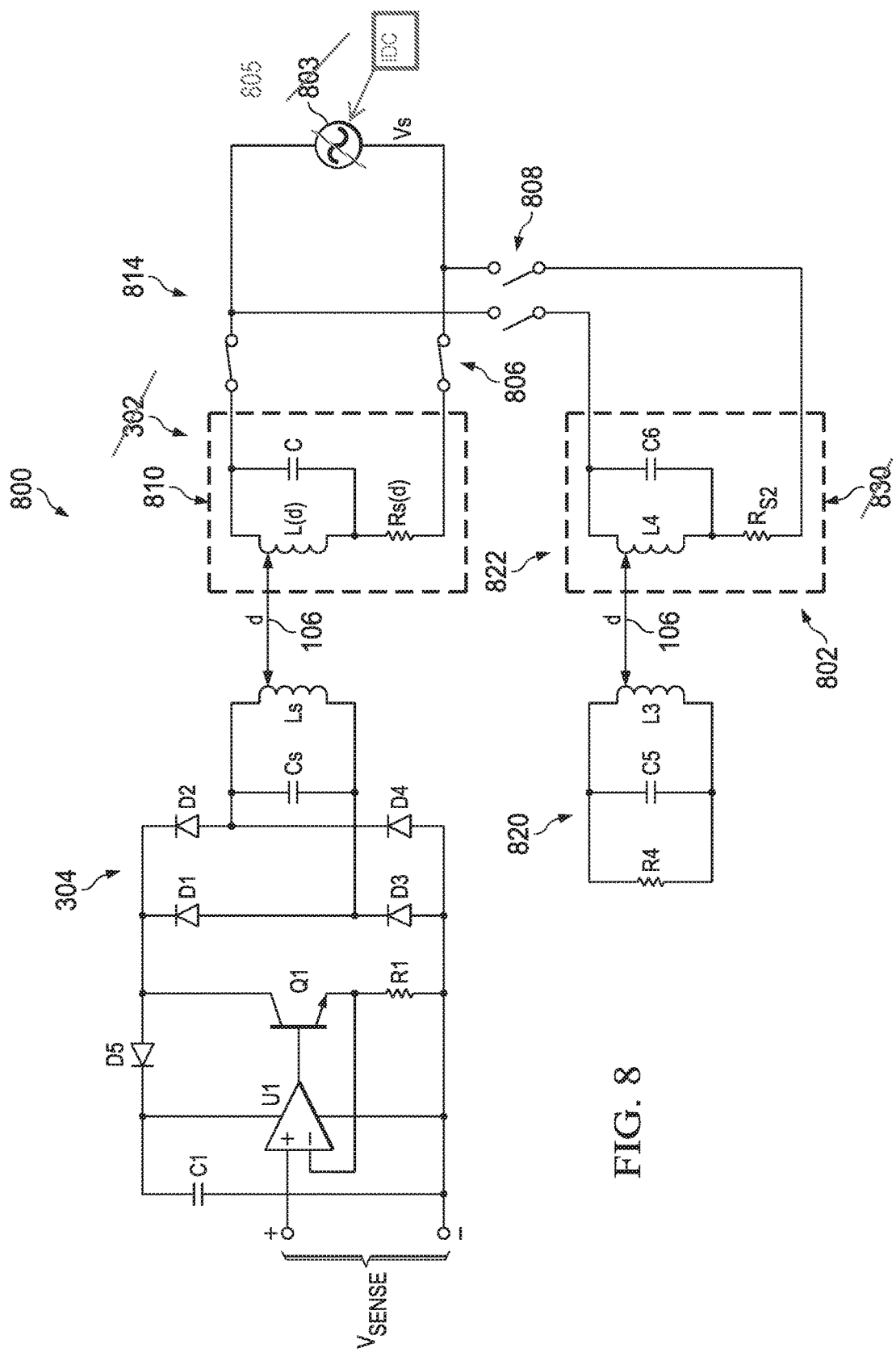
FIG. 8 is a schematic illustration of a calibration circuit for a remote sensing system.

FIG. 8 is a schematic diagram of a remote sensing system 800 with a calibration circuit 802 coupled thereto. The system 800 includes switches 806 and 808 that couple the AC voltage source 803 to either the first circuit 814 or the calibration circuit 802. The switches 806 close and the switches 808 open to couple the AC voltage source 803 to the first circuit 814 and its proximity sensor 810. Alternatively, the switches 806 open and the switches 808 close to couple the AC voltage source 803 to the calibration circuit 802 and proximity sensor 830 corresponding to the calibration circuit 802. The proximity sensor 830 of calibration circuit 822 may include inductor L4, capacitor C6, and virtual resistance $R_{S2}$.

The calibration circuit 802 includes a target circuit 820 and an induction circuit 822. The target circuit 820 has a resistance R4 that is connected in parallel with a capacitor C5 and an inductor L3. In some examples, the resistance has a value of approximately 10KΩ and the capacitor C5 and inductor L3 have the same values as the second inductor L2 and capacitor C1 in the second circuit 304. The induction circuit 822 includes the proximity sensor 830. The proximity sensor 830 measures the above-described magnetic loss by way of a virtual resistance $R_{S2}$ to determine the loss in the target circuit 820 caused by the resistance R4 when calibration circuit 802 is coupled to the voltage source 803. The calibration circuit 802 may be nearly co-located with the coils L1 and L2 of the first circuit 302 and the second circuit 304, so that variability in coupling and the impact of nearby metal objects is minimized through differential measurement techniques. The calculation of the resistance $R_{S2}$ through the proximity sensor 830 determines scale and offset factors for the voltage or current measurement because the resistance R4 is known and presents a known magnetic loss as seen by the first circuit 802.

While an illustrative and presently preferred embodiment of the disclosure have been described in detail herein, it is to be understood that the inventive concepts may be otherwise variously embodied and employed and that the appended claims are intended to be construed to include such variations except insofar as limited by the prior art.

What is claimed is:

1. A remote sensing circuit comprising: a first circuit comprising:
   a first coil,
   inductance-to-digital conversion circuitry configured:
   to drive a current through the first coil to generate a magnetic field, and
   to detect a change in the magnetic field; and
   a second circuit comprising:
   a second coil located a distance from the first coil, and
   remote sensing circuitry including a sense input to receive a sensed electrical signal, and configured:
   to drive the second coil with a sense current proportional to the sensed electrical signal to generate a corresponding magnetic loading field,
   the magnetic loading field loading the magnetic field of the first coil,
   wherein the inductance-to-digital conversion circuitry is configured to detect the loading of the magnetic field of the first coil as correlated to the sensed electrical signal.

2. The remote sensing system of claim 1, wherein the magnetic field of the first coil induces a voltage in the second coil, the induced voltage providing a reference voltage to at least one electronic component of the remote sensing circuitry.

3. The remote sensing system of claim 1, wherein the second circuit further comprises:
   a rectifier coupled to the second coil, the rectifier configured to rectify a voltage induced in the second coil by the magnetic field of the first coil.

4. The remote sensing system of claim 3, wherein the second circuit further comprises:
   a filter coupled to the rectifier and configured to convert the rectified voltage to a substantially direct current (DC) voltage.

5. The remote sensing system of claim 1 further comprising:
   a calibration circuit including:
   a third coil switchably coupled to the IDC circuit, wherein, when coupled to the third coil, the IDC circuit is configured to drive the third coil to generate a magnetic field different from the magnetic field generated by the first coil;
   a fourth coil located a defined distance from the third coil, wherein the magnetic field generated by the third coil induces a voltage in the fourth coil; and
   a resistor with a defined resistance, coupled to the fourth coil to present a known magnetic loss in the magnetic field generated by the third coil.

6. The remote sensing system of claim 1, wherein the sensed electrical field is one of a sensed voltage and a sensed current.

7. The remote sensing system of claim 1, wherein the remote sensing circuitry comprises a voltage-to-current converter configured to convert the sensed electrical signal received at the sense input to current, the voltage-to-current converter comprises:

a transistor including a control input, and a resistor coupled to the transistor; a differential amplifier having a non-inverting input coupled to receive a sensed voltage based on the sensed electrical signal received at the sense input, and an inverting input coupled to the resistor;

the differential amplifier driving the control input to the transistor with a voltage corresponding to the sensed voltage, such that the sensed voltage appears across the resistor, and the corresponding sense current flows through the transistor.

8. The remote sensing system of claim 7, wherein the sensed electrical signal is a sensed current, and wherein the remote sensing circuitry further comprises:

a trans-impedance amplifier with an output coupled to the noninverting input to the differential amplifier;

the trans-impedance amplifier coupled to receive the sensed current, and configured to convert the sensed current to a corresponding sensed voltage for input to the differential amplifier.

9. A method for measuring a remote sensed electrical signal, the method comprising:

generating a magnetic field by driving a current in a first coil;

receiving the remote sensed electrical signal;

driving a second coil, located a distance from the first coil, with a sense current proportional to the received remote sensed electrical signal to generate a corresponding magnetic loading field;

detecting a change in the magnetic field of the first coil in response to the magnetic loading field using inductance-to-digital conversion circuitry; and determining a magnitude of the remote sensed electrical signal based on the detected change in the magnetic field of the first coil as correlated to the sensed electrical signal.

10. The method of claim 9 wherein the sensed electrical field is one of a sensed voltage and a sensed current.

11. The method of claim 9 further comprising:

inducing a voltage in the second coil in response to the generated magnetic field;

rectifying the voltage induced in the second coil;

filtering the rectified voltage; and providing at least one electronic component of the second circuit with the rectified voltage.

12. The method of claim 11, wherein driving the second coil with a sense current proportional to the received remote sensed electrical signal to generate the corresponding magnetic loading field is accomplished by one of:

converting a sensed voltage to the sense current; and converting a sensed current to the sensed voltage, and then converting the sensed voltage to the sense current.

13. The method of claim 9 further comprising:

driving a calibration current through a third coil, wherein the current passing through the first coil is a first current; and inducing in a fourth coil located a defined distance from the third coil, a calibration magnetic field in a fourth coil in response to the calibration current and a resistance defined to present a known magnetic loss in the magnetic field generated by the third coil.

14. A system for remote inductive sensing, including a sensor coil and a sensing coil, the sensing coil located a distance from the sensor coil, the system comprising:

a sensor circuit including inductance-to-digital conversion circuitry configured to drive a current through the sensor coil to generate a magnetic field, and to detect a change in the magnetic field; and a sensing circuit including remote sensing circuitry including a sense input to receive a sensed electrical signal, and configured: to drive the sensing coil with a sense current proportional to the sensed electrical signal to generate a corresponding magnetic loading field, the magnetic loading field loading the magnetic field of the first coil; wherein the inductance-to-digital conversion circuitry is configured to detect the loading of the magnetic field of the first coil as correlated to the sensed electrical signal.

15. The system of claim 14, wherein the sensed electrical field is one of a sensed voltage and a sensed current.

16. The system of claim 14, wherein the magnetic field of the sensor coil induces a voltage in the sensing coil, the induced voltage providing a reference voltage to at least one electronic component of the remote sensing circuitry.

17. The system of claim 14 further comprising:

a calibration circuit including:

a sensor calibration coil switchably coupled to the inductance-to-data conversion circuitry, wherein, when coupled to the sensor calibration coil, the inductance-to-data conversion circuitry is configured to drive the sensor calibration coil to generate a magnetic field different from the magnetic field generated by the first coil;

a sensing calibration coil located a defined distance from the sensor calibration coil, wherein the magnetic field generated by the sensing calibration coil induces a voltage in the fourth coil; and a resistor with a defined resistance, coupled to the sensing calibration coil to present a known magnetic loss in the magnetic field generated by the third coil.

18. The system of claim 14, wherein the remote sensing circuitry comprises a voltage-to-current converter configured to convert the sensed electrical signal received at the sense input to current, the voltage-to-current converter comprises:

a transistor including a control input, and a resistor coupled to the transistor; a differential amplifier having a non-inverting input coupled to receive a sensed voltage based on the sensed electrical signal received at the sense input, and an inverting input coupled to the resistor;

the differential amplifier driving the control input to the transistor with a voltage corresponding to the sensed voltage, such that the sensed voltage appears across the resistor, and the corresponding sense current flows through the transistor.

19. The system of claim 18, wherein the sensed electrical signal is a sensed current, and wherein the remote sensing circuitry further comprises:

a trans-impedance amplifier with an output coupled to the noninverting input to the differential amplifier;

the trans-impedance amplifier coupled to receive the sensed current, and configured to convert the sensed current to a corresponding sensed voltage for input to the differential amplifier.

20. The system of claim 14, wherein the sensor circuit and the sensing circuit comprise respective integrated circuits.

\* \* \* \* \*